United States Patent
Lee et al.

(10) Patent No.: US 11,387,186 B2
(45) Date of Patent: Jul. 12, 2022

(54) FAN-OUT PACKAGE WITH RABBET

(71) Applicant: ROCKLEY PHOTONICS LIMITED, London (GB)

(72) Inventors: Seungjae Lee, Pasadena, CA (US); Brett Sawyer, Pasadena, CA (US); Chia-Te Chou, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 14 days.

(21) Appl. No.: 16/690,054

(22) Filed: Nov. 20, 2019

(65) Prior Publication Data
US 2020/0161243 A1 May 21, 2020

Related U.S. Application Data

(60) Provisional application No. 62/770,500, filed on Nov. 21, 2018.

(51) Int. Cl.
| | | |
|---|---|---|
| *H01L 23/538* | (2006.01) | |
| *H01L 21/56* | (2006.01) | |
| *H01L 21/78* | (2006.01) | |
| *H01L 23/31* | (2006.01) | |

(52) U.S. Cl.
CPC ........ *H01L 23/5384* (2013.01); *H01L 21/561* (2013.01); *H01L 21/563* (2013.01); *H01L 21/78* (2013.01); *H01L 23/3121* (2013.01)

(58) Field of Classification Search
CPC . H01L 23/5384; H01L 21/561; H01L 21/563; H01L 21/78; H01L 23/3121; H01L 23/3128; H01L 2224/16145; H01L 24/97; H01L 2224/32225; H01L 2224/73204; H01L 2924/3025; H01L 2224/16227; H01L 2224/92125; H01L 2924/3011; H01L 2924/1815; H01L 2224/04105; H01L 2224/12105; H01L 24/19
See application file for complete search history.

(56) References Cited

U.S. PATENT DOCUMENTS

| | | | | |
|---|---|---|---|---|
| 8,487,420 B1 * | 7/2013 | Hwang | .................. | H01L 25/03 257/686 |
| 2015/0171019 A1 * | 6/2015 | Shibuya | .............. | H01L 23/3121 257/659 |
| 2015/0348946 A1 | 12/2015 | Dohi | | |

OTHER PUBLICATIONS

Invitation to Pay Additional Fees and Partial International Search, for International Application No. PCT/EP2019/081964, dated Jan. 31, 2020, 14 pages.
International Search Report and Written Opinion of the International Searching Authority, for International Application No. PCT/EP2019/081964, dated Mar. 24, 2020, 19 pages.
U.K. Intellectual Property Office Examination Report, dated Apr. 8, 2022, for Patent Application No. GB2108861.2, 4 pages.

* cited by examiner

*Primary Examiner* — Cuong B Nguyen
(74) *Attorney, Agent, or Firm* — Lewis Roca Rothgerber Christie LLP

(57) ABSTRACT

A system integrating a fan-out package, including a first semiconductor die, with a second semiconductor die. In some embodiments the fan-out package includes the first semiconductor die, a mold compound, covering the first semiconductor die on at least two sides, and an electrical contact, on a lower surface of the first semiconductor die. The fan-out package may have a rabbet along a portion of a lower edge of the fan-out package.

27 Claims, 12 Drawing Sheets

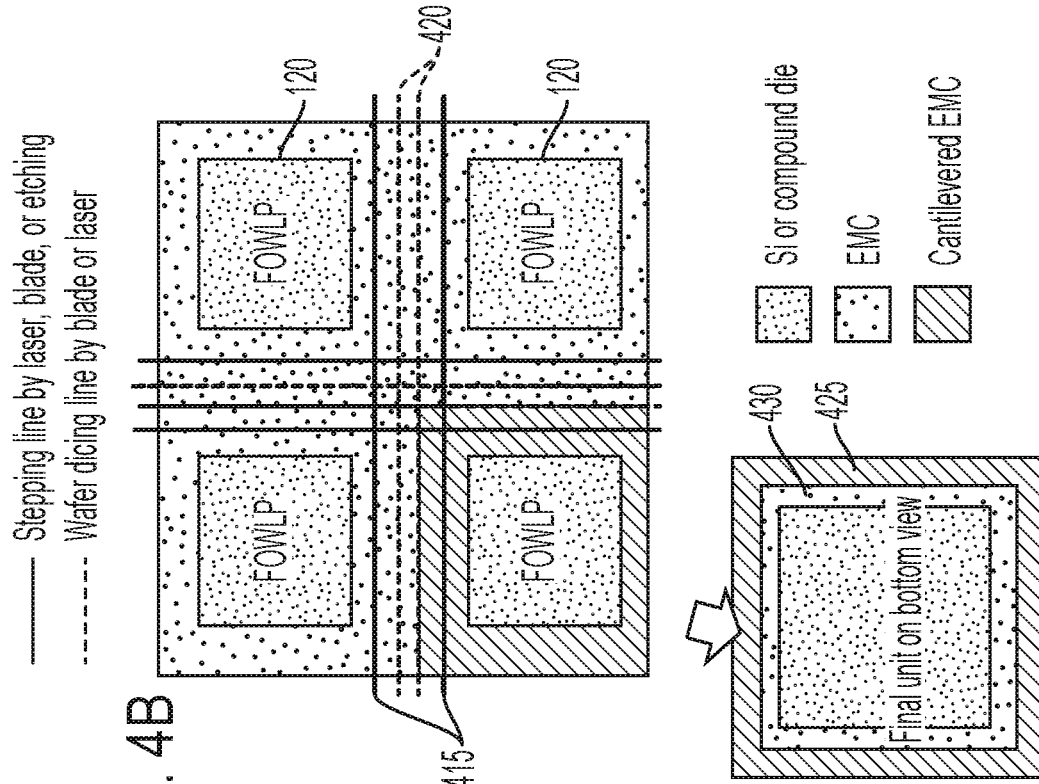
FIG. 4B
FIG. 4C
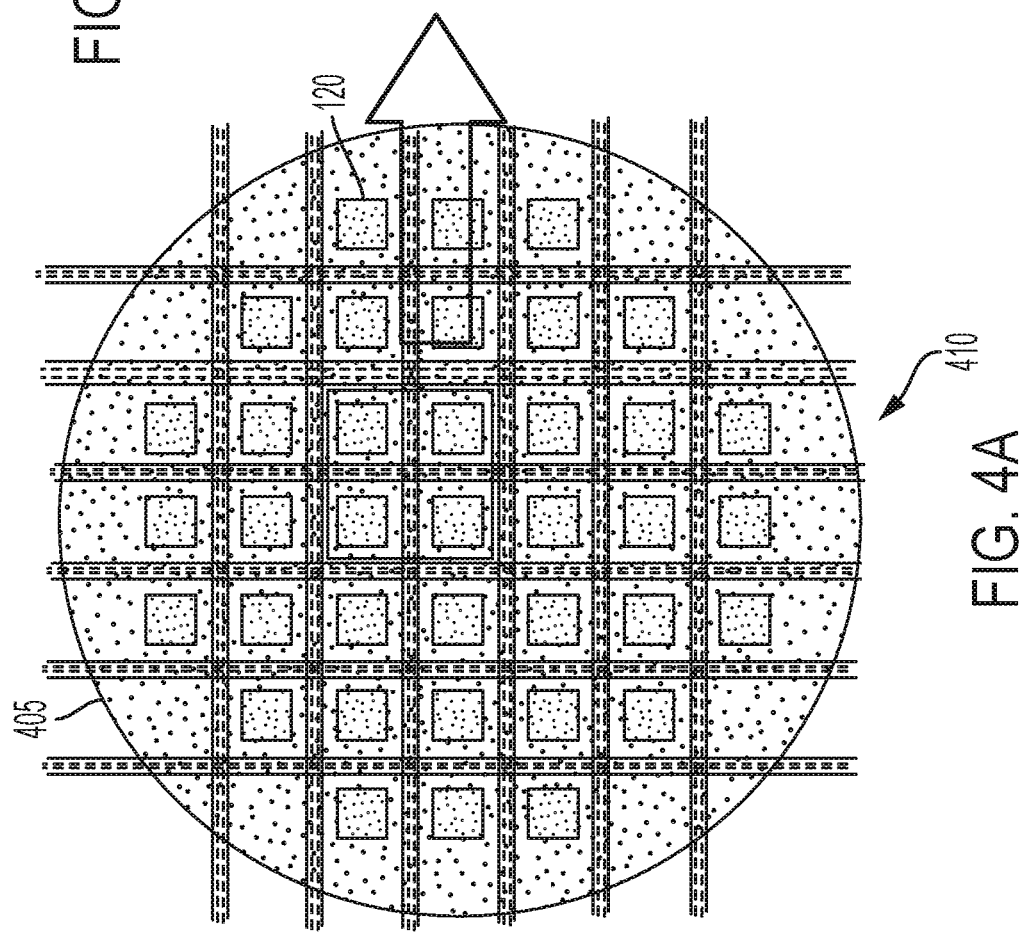
FIG. 4A

Normal RDL and Bumping on FOWLP

Stepping EMC and RDL by laser, blade, or etching

Blade or laser dicing

FAN-OUT PACKAGE WITH RABBET

CROSS-REFERENCE TO RELATED APPLICATION(S)

The present application claims priority to and the benefit of U.S. Provisional Application No. 62/770,500, filed Nov. 21, 2018, entitled "FAN-OUT PACKAGE WITH RABBET", the entire content of which is incorporated herein by reference.

FIELD

One or more aspects of embodiments according to the present disclosure relate to packaging, and more particularly to a fan-out package having a rabbet.

BACKGROUND

In applications in which an optoelectronic device is to be connected to an electronic integrated circuit, it may be advantageous, especially in high-speed applications, to position the parts close together so that the electrical path between them may be short. This may be challenging if, for example, the package of the electronic integrated circuit has a significantly larger envelope than the electronic integrated circuit die, and if there is potential mechanical interference between the optoelectronic device and the package of the electronic integrated circuit.

Thus, there is a need for an improved system and method for integrating an optoelectronic device and an electronic integrated circuit.

SUMMARY

According to an embodiment of the present invention, there is provided a system, including: a fan-out package, including: a first semiconductor die; a mold compound, covering the first semiconductor die on at least two sides; and an electrical contact, on a lower surface of the first semiconductor die, the fan-out package having a rabbet along a portion of a lower edge of the fan-out package.

In some embodiments, the vertical depth of the rabbet is between 10 and 500 microns.

In some embodiments, the horizontal depth of the rabbet is between 10 and 500 microns.

In some embodiments, the fan-out package further includes a redistribution layer, the redistribution layer being on a lower surface of the fan-out package.

In some embodiments, a portion of a vertical surface of the rabbet is an edge surface of the redistribution layer.

In some embodiments, the rabbet does not extend into the first semiconductor die.

In some embodiments, the system further includes: a second semiconductor die; and a shared support element, the second semiconductor die and the fan-out package both being secured to an upper surface of the shared support element.

In some embodiments, the system further includes an electrically conductive path between the first semiconductor die and the second semiconductor die, the electrically conductive path having a length less than 200 microns.

In some embodiments, the clearance between the second semiconductor die and the fan-out package is at least 2 microns.

In some embodiments, the clearance between the second semiconductor die and the fan-out package is at most 100 microns.

In some embodiments, an upper edge of the second semiconductor die extends into the rabbet.

In some embodiments, the system further includes a layer of underfill between the fan-out package and shared support element, the layer of underfill extending horizontally to the second semiconductor die.

In some embodiments, the underfill does not extend farther from the fan-out package than the part of the second semiconductor die most distant from the fan-out package.

According to an embodiment of the present invention, there is provided a method for fabricating a fan-out package, the method including: fabricating a carrier including: a layer of mold compound; a plurality of semiconductor dies, embedded in the mold compound; and a redistribution layer, on the semiconductor dies and the mold compound; cutting a first channel into the carrier, the first channel having a first width and a first depth, and extending between a first semiconductor die of the plurality of semiconductor dies and a second semiconductor die of the plurality of semiconductor dies; and cutting a second channel into the carrier, within the first channel, the second channel having a second width less than the first width and a second depth, from an upper surface of the carrier, greater than the first depth.

In some embodiments, the second channel has a depth equal to the thickness of the carrier and acts to separate a portion of the carrier on one side of the second channel from a portion of the carrier on the other side of the second channel.

In some embodiments, the first channel has a width exceeding a width of the second channel by between 30 and 100 microns.

In some embodiments, the first channel has a depth of between 30 and 100 microns.

In some embodiments, the method further includes: cutting a plurality of channels into the carrier to form a plurality of fan-out packages, the plurality of channels including the first channel and the second channel, forming a subassembly by: securing a first fan-out package, of the plurality of fan-out packages, to a shared support element, and securing a third semiconductor die to the shared support element, the subassembly including an electrically conductive path between the first semiconductor die and the third semiconductor die, the electrically conductive path having a length less than 200 microns.

In some embodiments, the method further includes: dispensing underfill between the first fan-out package and the shared support element, and damming, by the third semiconductor die, the underfill during the dispensing.

BRIEF DESCRIPTION OF THE DRAWINGS

These and other features and advantages of the present disclosure will be appreciated and understood with reference to the specification, claims, and appended drawings wherein:

FIG. 4A is a top view of a carrier with a plurality of semiconductor dies, according to an embodiment of the present disclosure;

FIG. 4B is a top view of a portion of a carrier with a plurality of semiconductor dies, according to an embodiment of the present disclosure;

FIG. 4C is a bottom view of a fan-out package, according to an embodiment of the present disclosure;

DETAILED DESCRIPTION

The detailed description set forth below in connection with the appended drawings is intended as a description of exemplary embodiments of a fan-out package with a rabbet provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
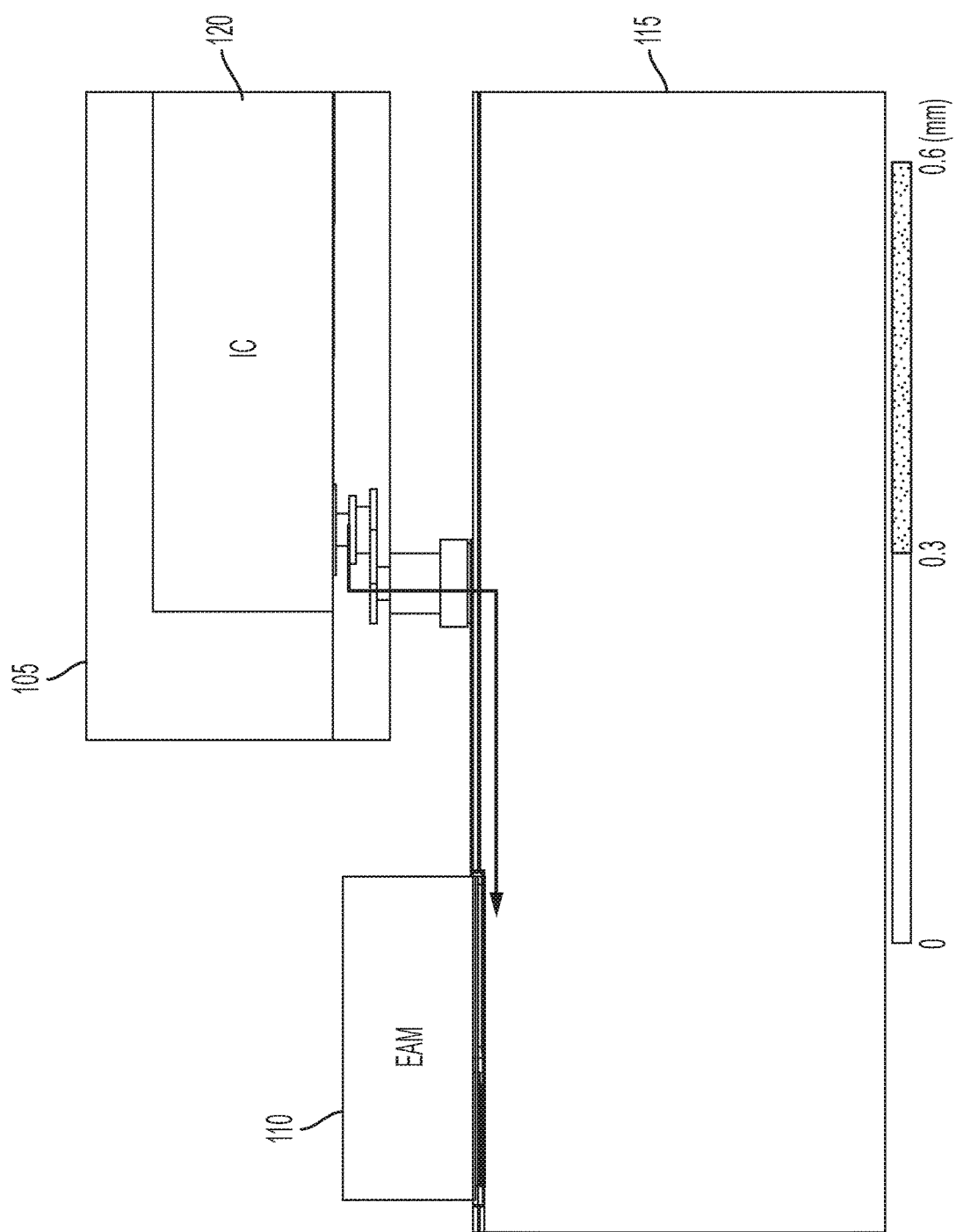
FIG. 1 is a side cross sectional view of a fan-out package and a semiconductor die on a shared support element, according to an embodiment of the present disclosure.
Figure 2:
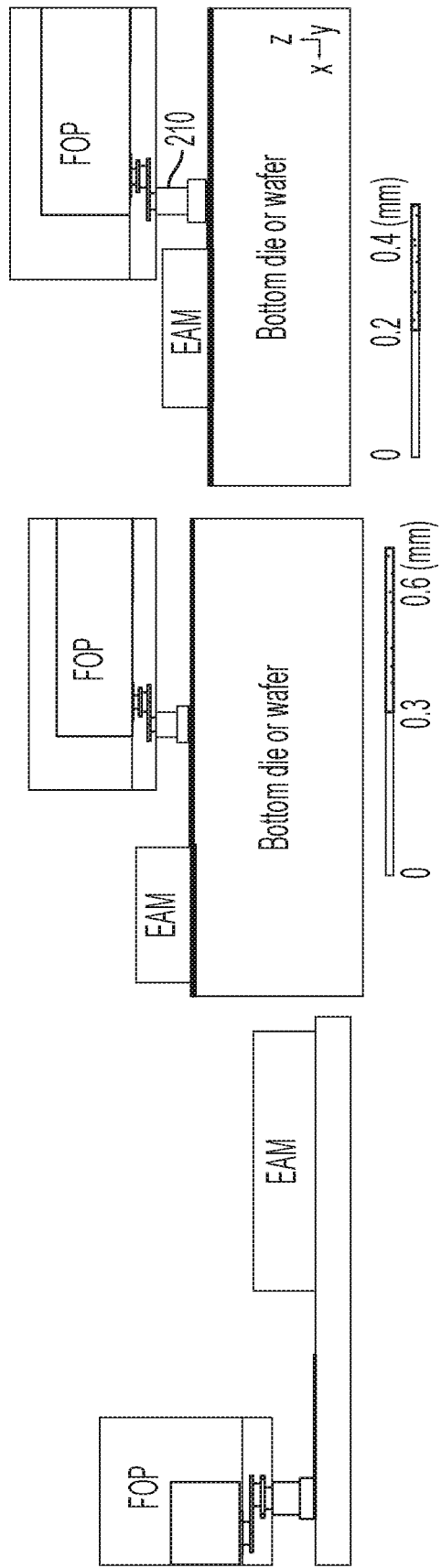
FIG. 2A is a side cross sectional view of a fan-out package and a semiconductor die on a shared support element, according to an embodiment of the present disclosure.
FIG. 2B is a side cross sectional view of a fan-out package and a semiconductor die on a shared support element, according to an embodiment of the present disclosure.
FIG. 2C is a side cross sectional view of a fan-out package and a semiconductor die on a shared support element, according to an embodiment of the present disclosure.

Referring to FIG. 1, in a subassembly including a fan-out package 105 (which may include a first semiconductor die 120, e.g., a silicon CMOS chip) and a second semiconductor die 110 (e.g., an optoelectronic device, such as an electro-absorption modulator (EAM), a laser, or a photodetector) on a shared support element 115, or "bottom wafer" (e.g., a substrate or another semiconductor die, such as a photonic integrated circuit (PIC)), it may be advantageous to minimize the length of an electrically conductive path (shown as an arrow in FIG. 1) between the second semiconductor die 110 and the first semiconductor die 120 (e.g., a CMOS chip) in the fan-out package 105. Such minimization may improve characteristic impedance, delay, electromagnetic interference (EMI), and electromagnetic compatibility (EMC). Allowing a significant gap to exist between the second semiconductor die 110 and the fan-out package 105, as shown in FIG. 2A, may be disadvantageous because it may result in a long electrically conductive path between the second semiconductor die 110 and the first semiconductor die 120 in the fan-out package 105.

Moving one or both of the second semiconductor die 110 and the fan-out package 105 horizontally to reduce the separation between them may reduce the length of the electrically conductive path but (i) if the separation is made too small (e.g., less than 50 microns or comparable to the placement accuracy of the parts or the package size tolerance), a yield reduction may result, from occasional contact between the parts, and (ii) if adequate separation is maintained to avoid a yield reduction, the length of the electrically conductive path may remain undesirably large. The fan-out package 105 may be made to overhang the second semiconductor die 110 as shown in FIG. 2C, but such a configuration may require significant thinning of second semiconductor die 110, or tall copper pillar bumps 210, or both, either of which may carry production challenges potentially resulting in a reduction in yield. In particular, high aspect ratio (>1:1) copper pillar bumps may be challenging to fabricate, tall copper pillar bumps (e.g., taller than 100 microns) may require a pitch of more than 150 microns (whereas system requirements may dictate a pitch of 100 microns or less), thinning the second semiconductor die 110 to less than 50 microns may result in a yield reduction, and using copper pillar bumps that are less than 50 microns from the edge of the package may result in a yield reduction. Underfill (UF) overflow (or "bleed out") (discussed in further detail below) may cause III-V performance degradation.

Figure 3:
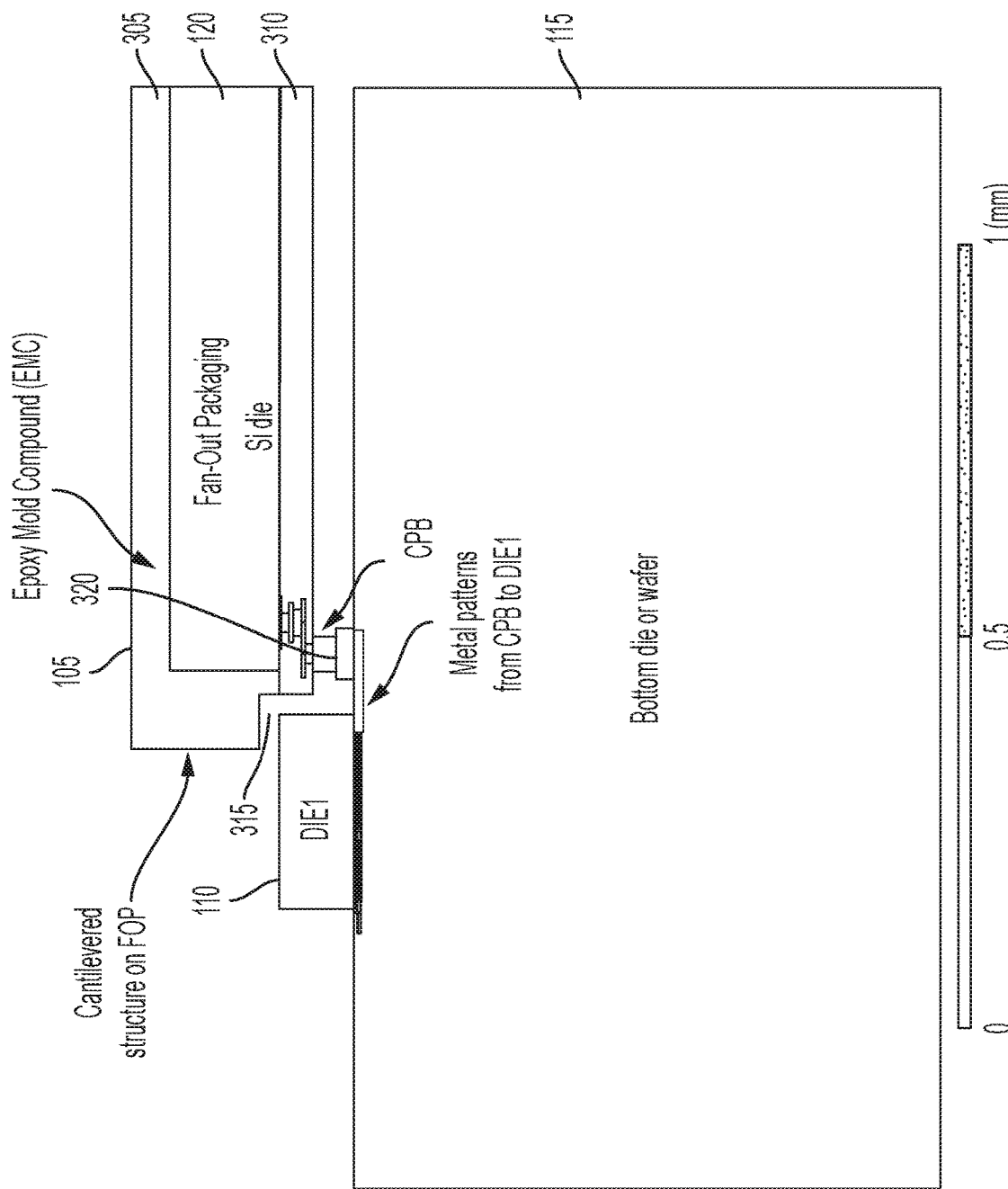
FIG. 3 is a side cross sectional view of a fan-out package and a semiconductor die on a shared support element, according to an embodiment of the present disclosure.

Referring to FIG. 3, in some embodiments, the fan-out package 105 includes, in addition to the first semiconductor die 120, a layer of mold compound 305 (e.g., epoxy mold compound (EMC)) and a redistribution layer (RDL) 310. A groove or rabbet 315 is cut into a lower edge of the fan-out package 105 to allow a portion of the fan-out package 105 to overhang the second semiconductor die 110 without using tall copper pillar bumps. As a result, a portion of the mold compound 305 may be cantilevered over the second semiconductor die 110 (i.e., it may overhang the second semiconductor die 110), as shown. A solder connection 320 may be used to secure each copper pillar bump (CPB) to metal patterns in the shared support element 115. Similarly the EAM may be flip chip bonded to support element 115 using standard solder methods. The second semiconductor die 110 of the embodiment of FIG. 3 may effectively act as an underfill dam (as discussed in further detail below) since it may be thicker than the die shown in FIG. 2C, and it may also allow a smaller underfill keep out zone (KOZ), compared to the dies (the "EAM" dies) shown in FIGS. 2A and 2B since the second semiconductor die 110 of the embodiment of FIG. 3 may be capable of damming the underfill just next to the rabbet. Improved damming of the underfill may reduce or prevent performance degradation of the second semiconductor die 110 due to bleedout. The edge of the keep out zone may be determined by the right edge of the second semiconductor die 110 in FIG. 3.

The mold compound 305 may include silica filler particles encased in and bound together with epoxy. The surfaces of the rabbet 315 may be rough, and may have characteristics depending on the process used to form the rabbet 315. For example, if laser cutting is used, a rough surface over which portions of filler particle protrude above the surface of the epoxy may be formed, because the laser may have the effect of removing the epoxy while leaving the filler particles undisturbed, except that if the epoxy securing any of the filler particles is entirely or nearly entirely removed, the filler particle may also be removed. If a blade is used to form the rabbet, then it may cut through some of the filler particles, or it may tear some of the filler particles out of the epoxy, leaving voids in the epoxy at the surface of the rabbet. In the terminology used herein, the surfaces of the rabbet are defined as surfaces that define a volume into which no residual material of the mold compound 305 (i.e., neither epoxy nor silica filler) protrudes.

Figure 5A:
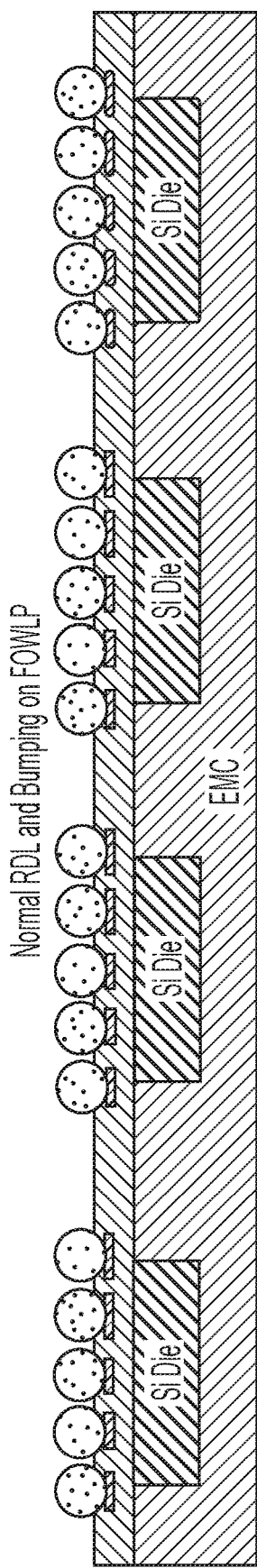
FIG. 5A is a side cross-sectional view of a carrier, according to an embodiment of the present disclosure.
Figure 5B:
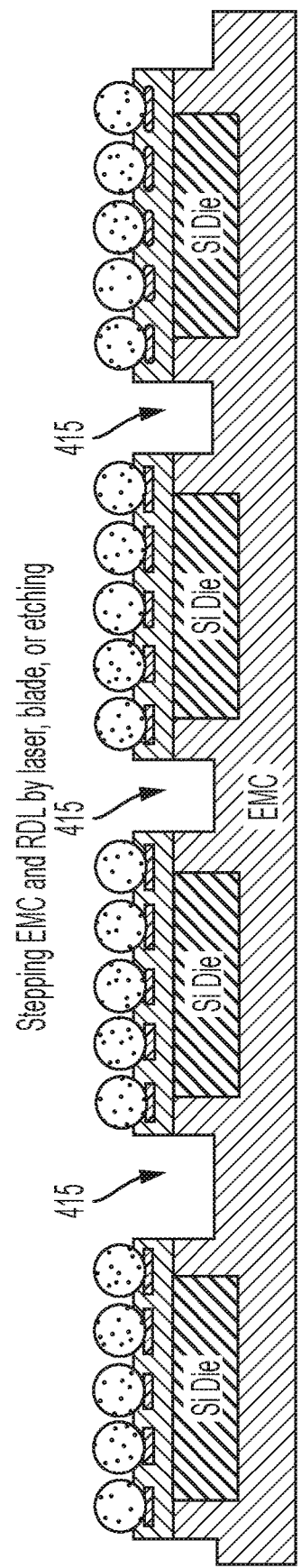
FIG. 5B is a side cross-sectional view of a carrier, according to an embodiment of the present disclosure.
Figure 5C:
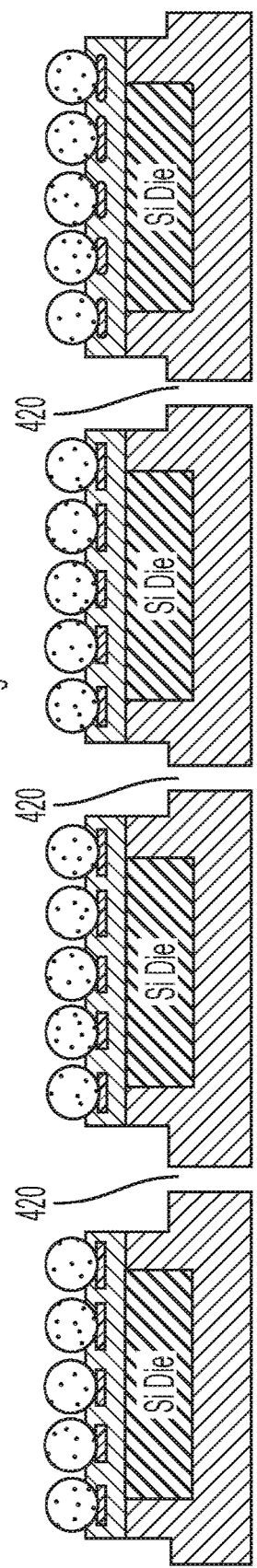
FIG. 5C is a side cross-sectional view of a carrier, according to an embodiment of the present disclosure.

FIGS. 4A-C show intermediate products and a final product, in the fabrication of a fan-out package 105. Referring to FIG. 4A, a plurality of first semiconductor dies 120 may be embedded in a sheet 405 of mold compound 305. A redistribution layer (drawn transparent in FIGS. 4A-4C, so that the first semiconductor dies 120 are visible) is deposited on the sheet 405 of mold compound 305 (and on the first semiconductor dies 120 embedded in it), to form a carrier 410. In some embodiments, the carrier is square or rectangular instead of being round as shown. Referring to FIG. 4B, a plurality of wide, shallow channels 415 are formed in the top surface of the carrier (e.g., using laser ablation or saw cuts), and a plurality of narrow, deep channels 420 are then formed (e.g., using a laser cut or a blade cut) in the wide, shallow channels 415. The narrow, deep channels 420 may extend all the way through the carrier, serving to cut it apart into individual packages (or they may extend nearly all the way through, so that the packages may then be readily separated). FIG. 4C shows a resulting fan-out package 105, with a region 425 of EMC that is cantilevered in the final assembly (FIG. 3) and a region 430 that remains covered by the redistribution layer 310. In this process what is referred to as the top surface of the carrier 410 becomes what is referred to as the bottom surface of the fan-out package 105. FIG. 5A shows a side cross-sectional view of the carrier 410; FIG. 5B shows the carrier 410 after the wide, shallow channels 415 have been cut, and FIG. 5C shows the carrier 410 after the narrow, deep channels 420 have also been cut. In the embodiment of FIGS. 5A-5C, the conductors on the top surface of the carrier 410 (which form conductors on the bottom surface of the fan-out package 105, that are subsequently used to form connections to the shared support element 115) are micro bumps, which may be composed of, e.g., copper, solder, nickel, or gold.

Figure 6A:
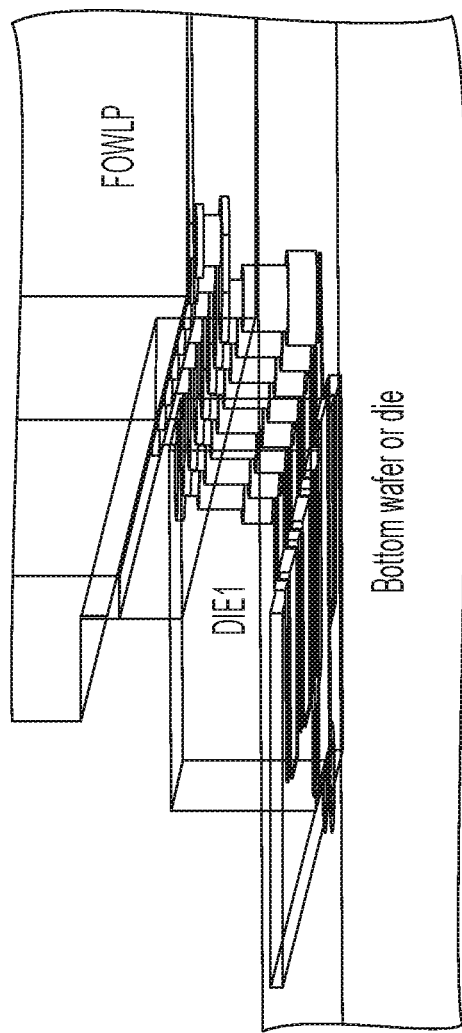
FIG. 6A is a perspective view of a fan-out package and a semiconductor die on a shared support element, according to an embodiment of the present disclosure.
Figure 6B:
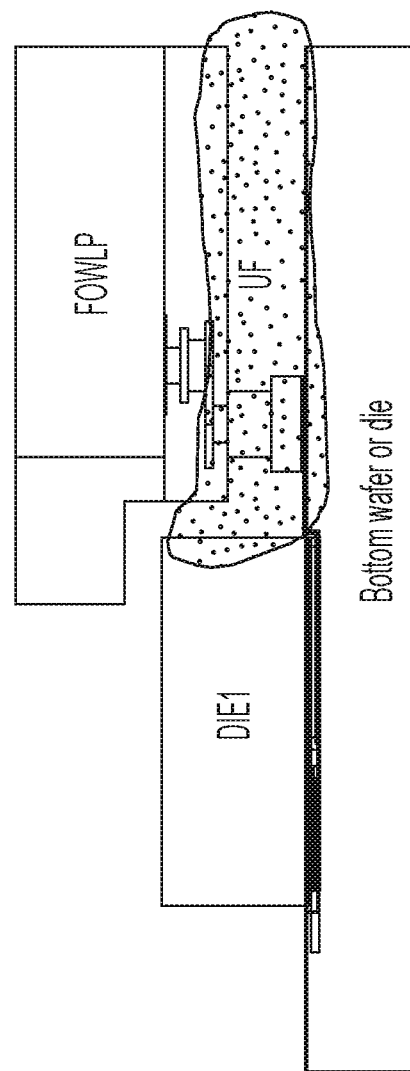
FIG. 6B is a side cross sectional view of a fan-out package and a semiconductor die on a shared support element, according to an embodiment of the present disclosure.

FIG. 6A shows a perspective view of a subassembly including a fan-out package 105 and a second semiconductor die 110 on a shared support element 115, and FIG. 6B shows a side view of the subassembly with underfill (UF) dispensed into the gap between the fan-out package 105 and the shared support element 115. The underfill material may be NCP (non-conductive paste) or NCF (non-conductive film). Thermal compression bonding (TCB) may be used to secure the fan-out package 105 to the shared support element 115. The assembly process flow may include dispensing, e.g., non-conductive paste on the fan-out package 105 or on the shared support element 115, placing the fan-out package 105 on the shared support element 115 (e.g., using a pick and place process), and bonding, using thermal compression bonding, copper pillars or gold stud bumps (that are on the bottom surface of the fan-out package 105) to the shared support element 115. The thermal compression process may provide local heating that may also cure the non-conductive paste (or non-conductive film).

Figure 6C:
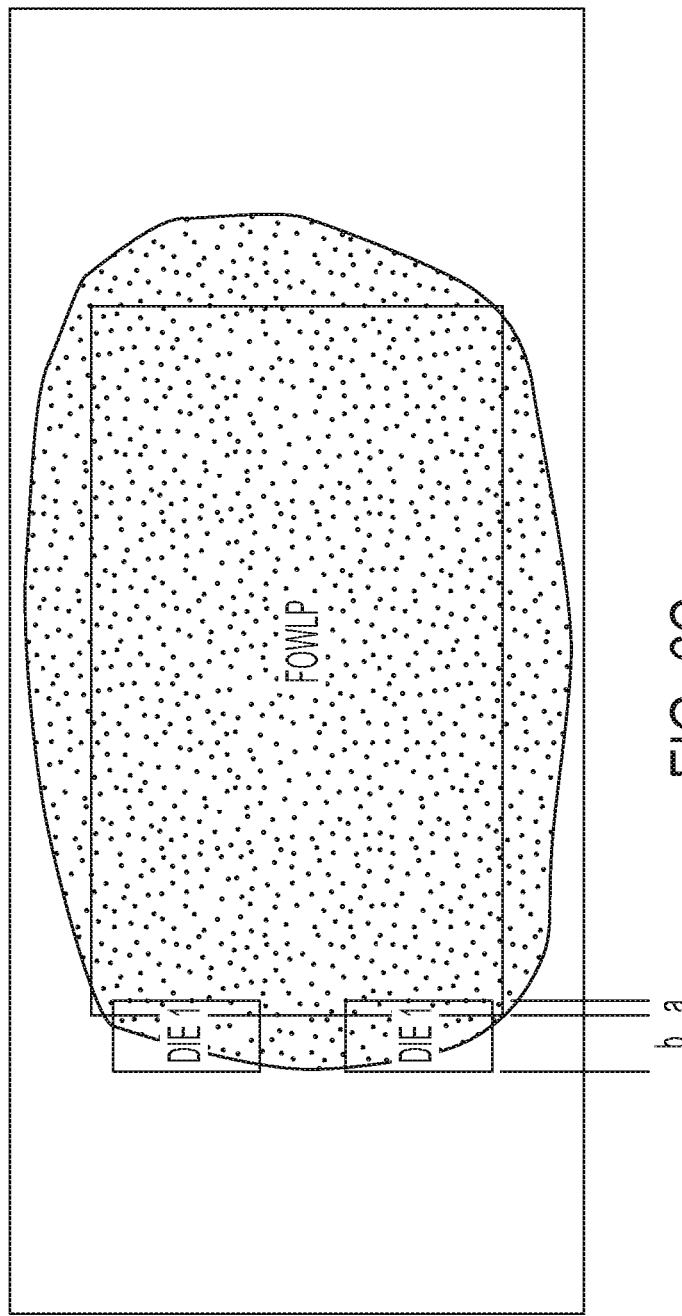
FIG. 6C is top view of a fan-out package and a semiconductor die on a shared support element, according to an embodiment of the present disclosure.
Figure 7:
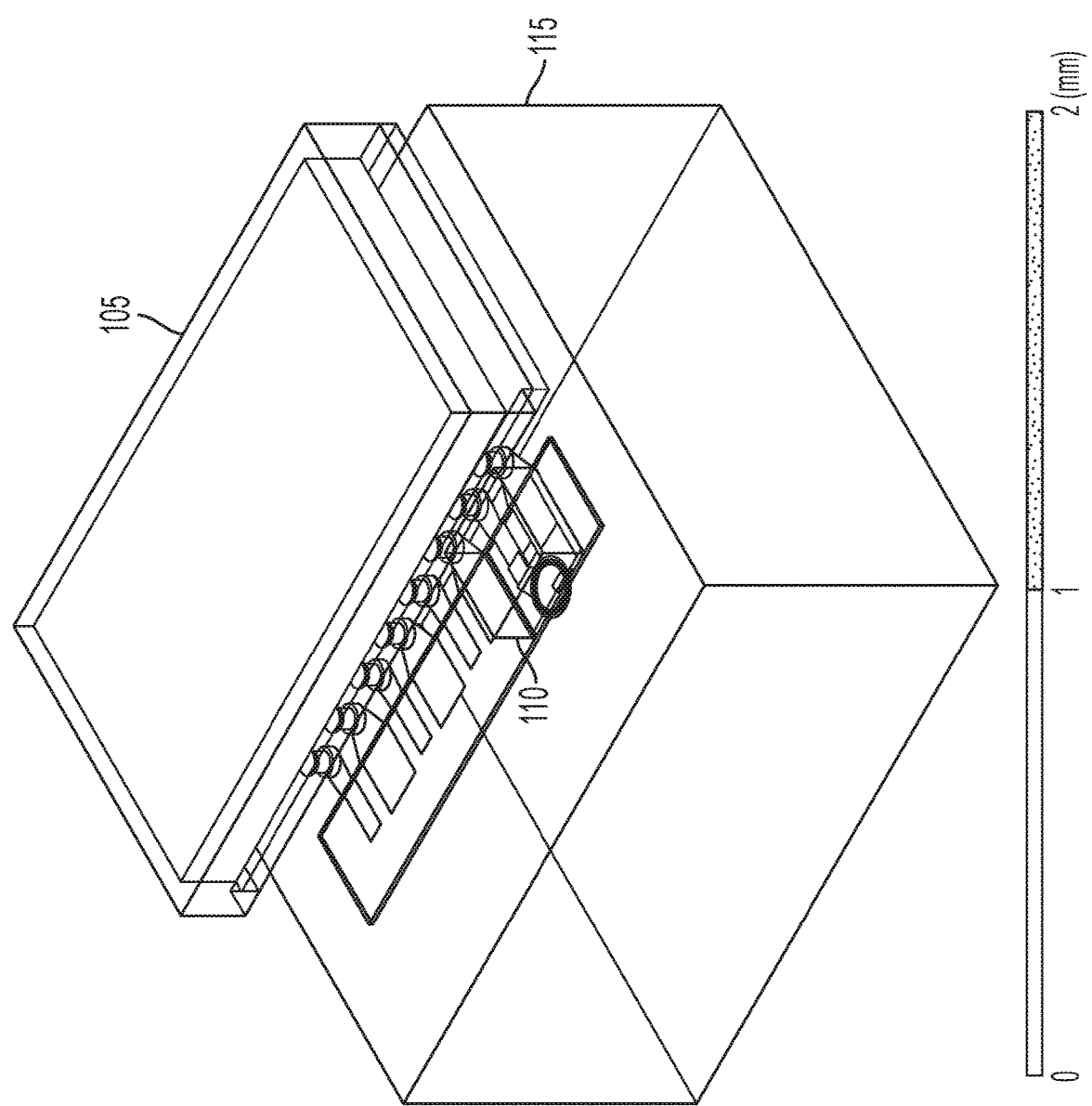
FIG. 7 is a perspective view of a fan-out package and a semiconductor die on a shared support element, according to an embodiment of the present disclosure.
Figure 8:
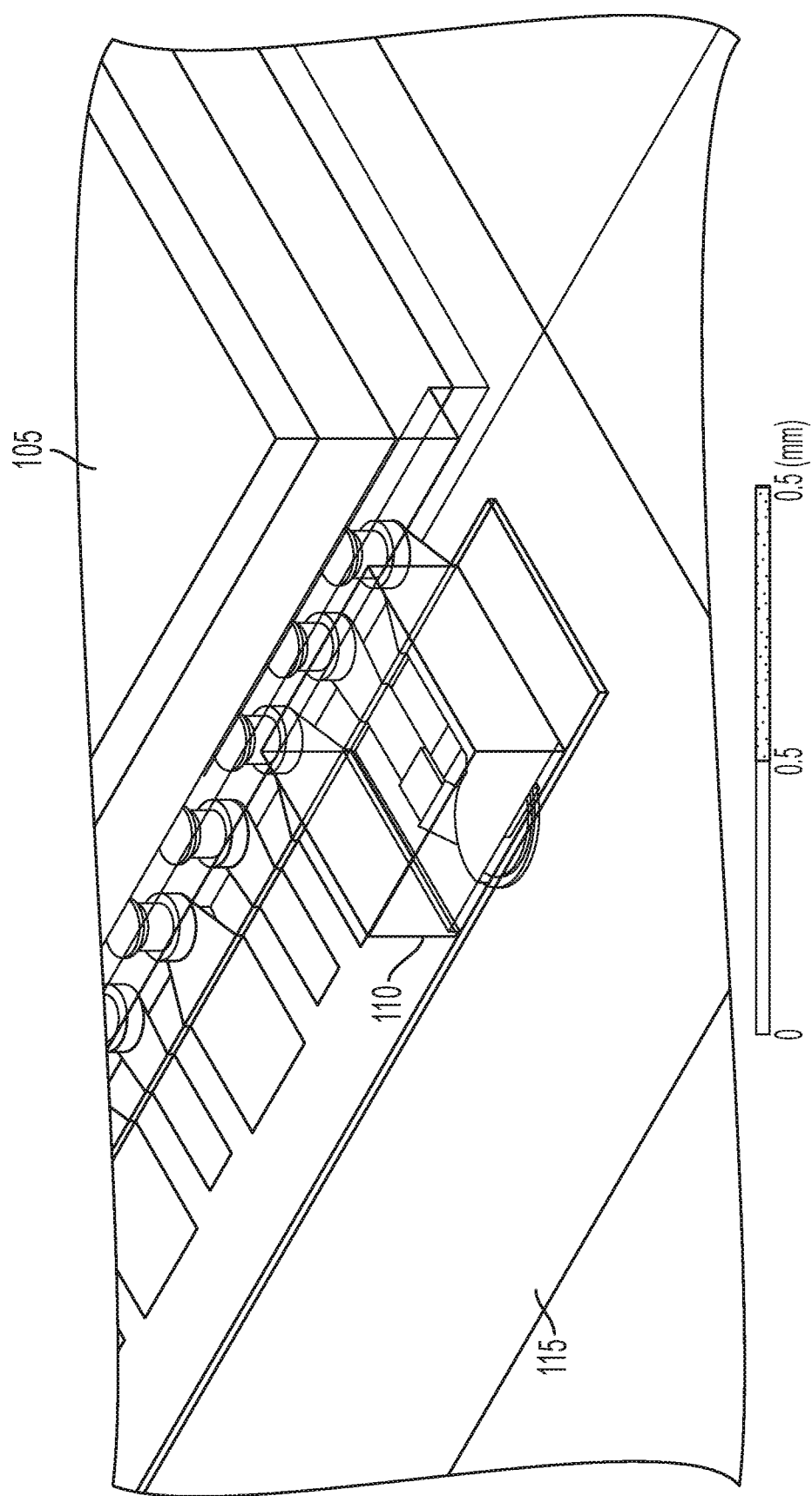
FIG. 8 is a perspective view of a fan-out package and a semiconductor die on a shared support element, according to an embodiment of the present disclosure.
Figure 9:
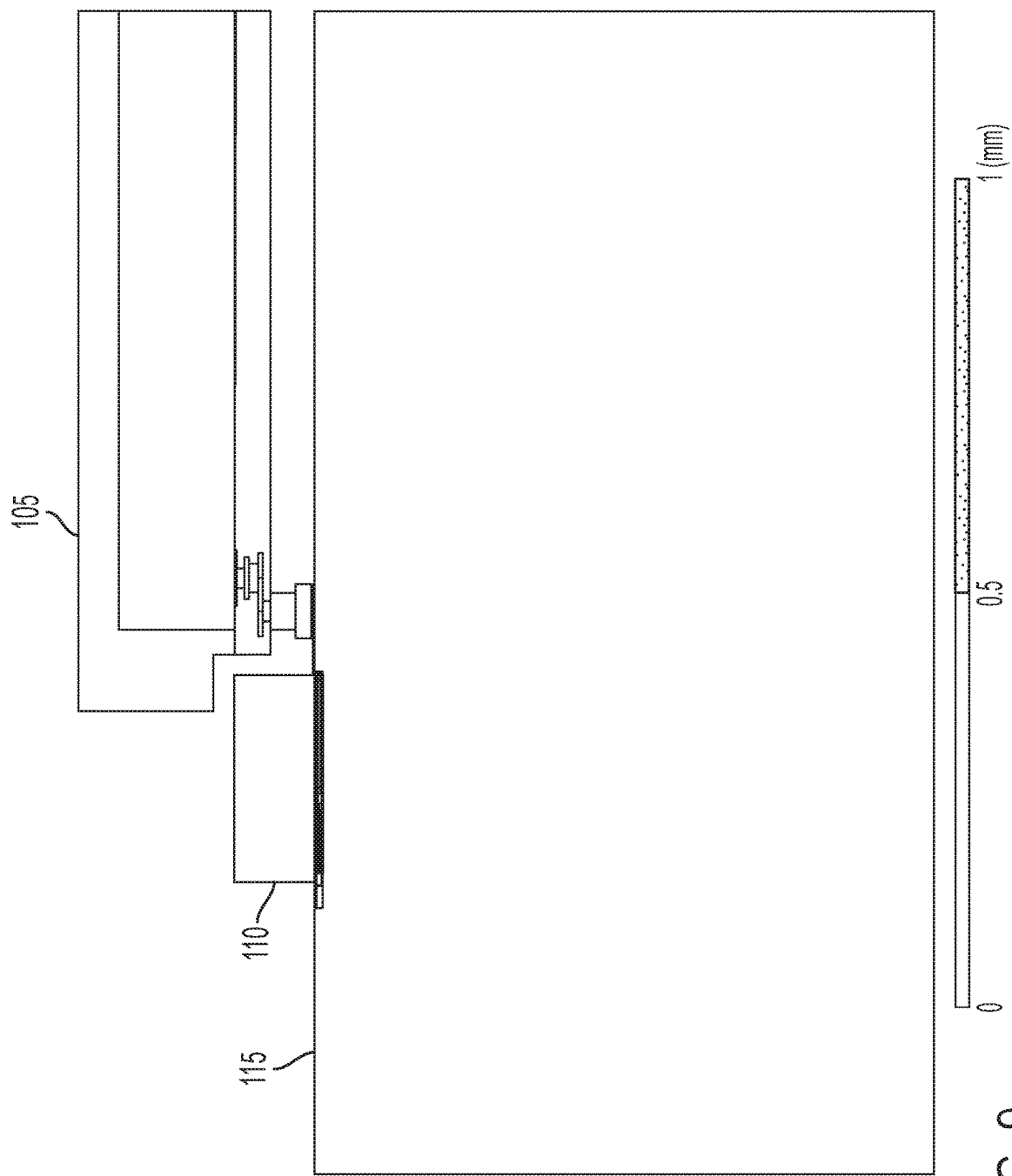
FIG. 9 is a side view of a fan-out package and a semiconductor die on a shared support element, according to an embodiment of the present disclosure.
Figure 10:
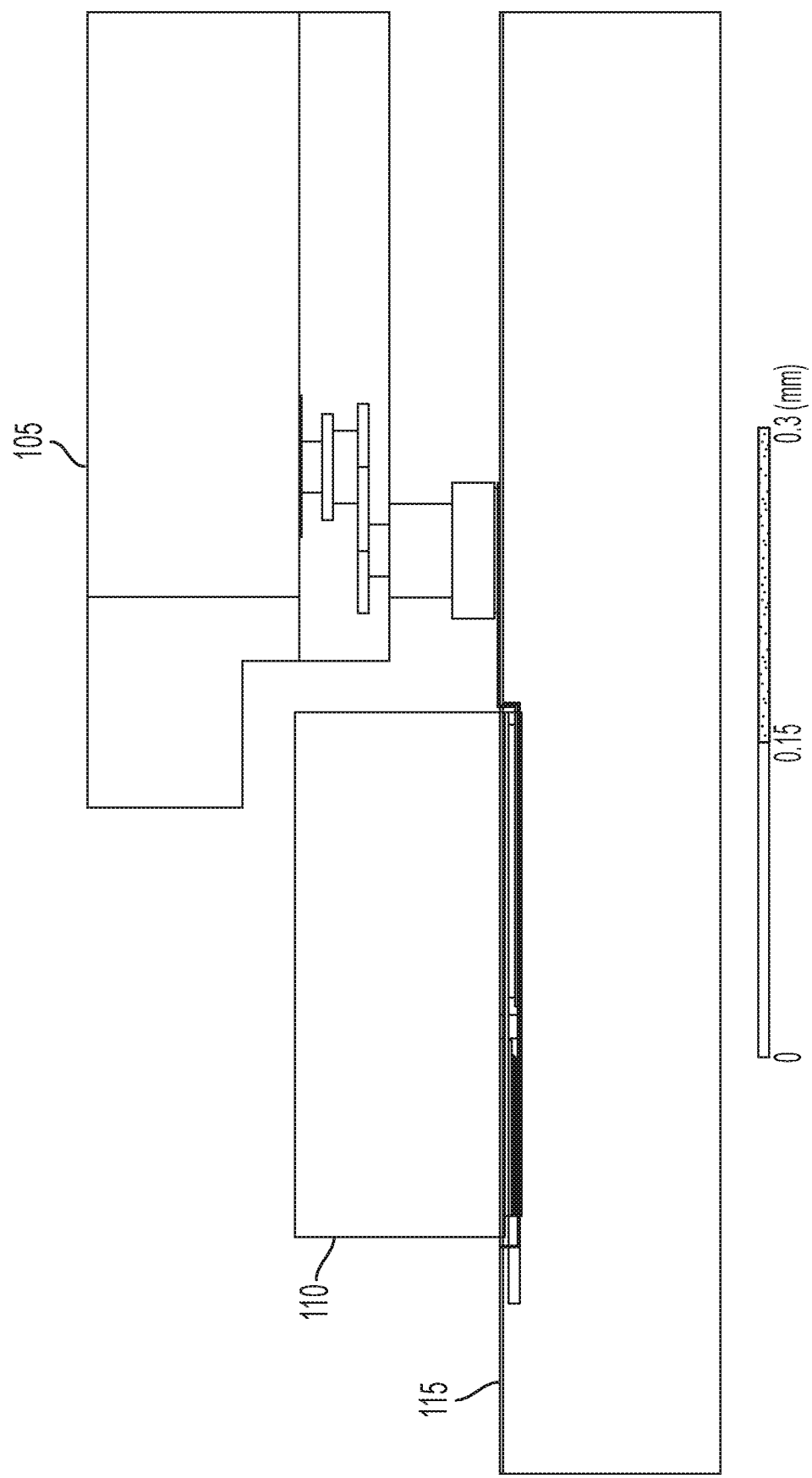
FIG. 10 is a side view of a fan-out package and a semiconductor die on a shared support element, according to an embodiment of the present disclosure.
Figure 11:
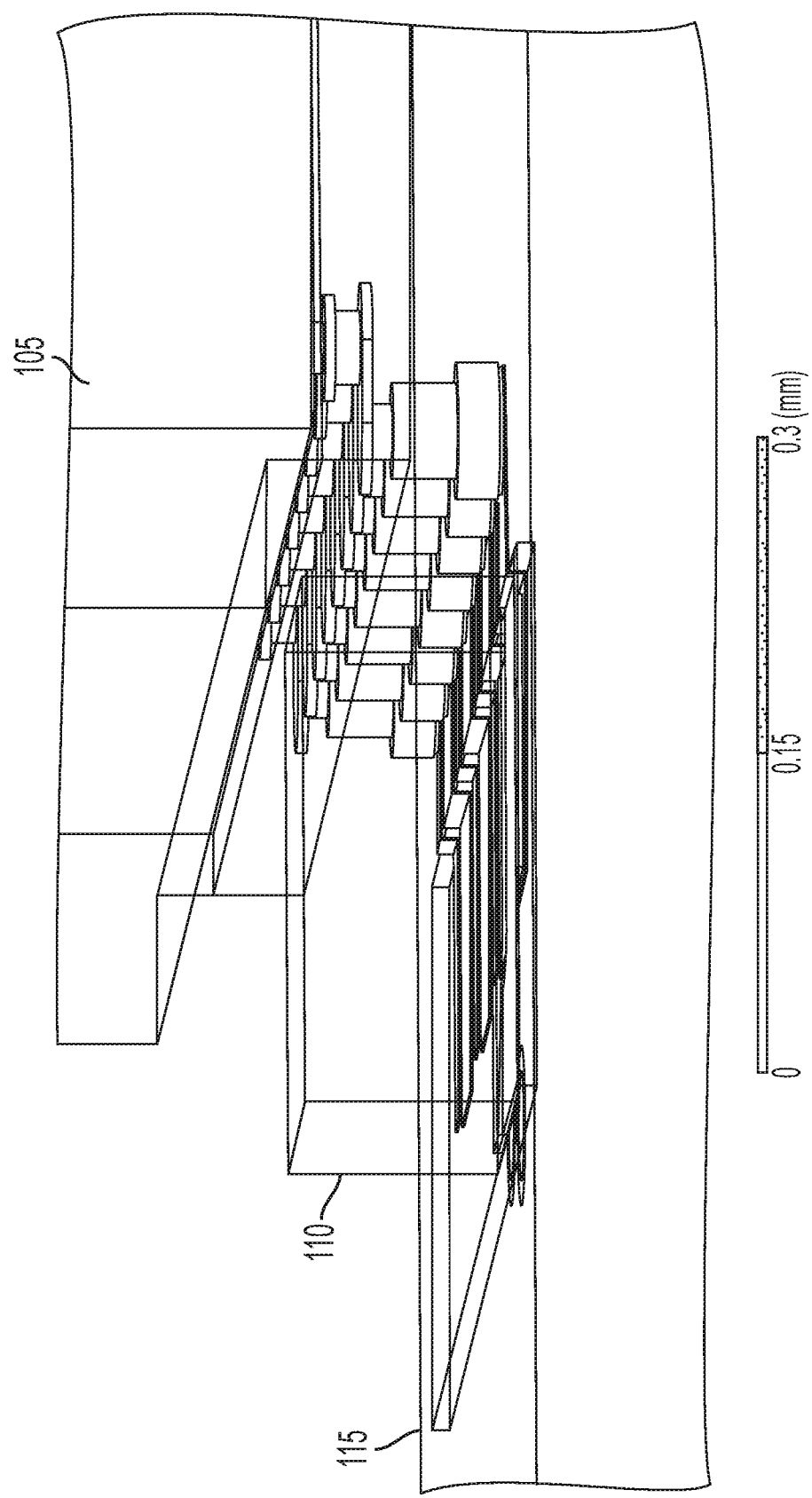
FIG. 11 is a perspective view of a fan-out package and a semiconductor die on a shared support element, according to an embodiment of the present disclosure.

Referring to FIG. 6C, the presence of second semiconductor dies 110 (labeled "DIE 1" in FIG. 6C) at the edge of (and extending into the rabbet 315 of) the fan-out package 105 (labeled "FOWLP" in FIG. 6C) may be advantageous in this process because the second semiconductor dies 110 may act as a dam to limit bleed out of the underfill. Initially, after the fan-out package 105 is placed on the shared support element 115 and before heat is applied (as part of the thermal compression process), the presence of the second semiconductor dies 110 may act as a dam to reduce the rate at which, e.g., the non-conductive paste flows out from under the fan-out package 105. Moreover, once heat is applied and the temperature of the non-conductive paste increases, the viscosity of the non-conductive paste increases as it begins to cure, further slowing the rate at which it flows out from under the fan-out package 105 and spreads out away from the fan-out package 105. In a system in which the second semiconductor dies 110 are more distant from the fan-out package 105 or absent entirely, the non-conductive paste may flow out from under the fan-out package 105 more rapidly before heat is applied, and the portion of the non-conductive paste that flows out from under the fan-out package 105 before heat is applied may remain relatively cool after heat is applied, causing its viscosity to remain lower and enabling it to spread over a greater area. The surface tension of the non-conductive paste may also accelerate the rate at which it spreads out on the shared support element 115, if the top surface of the shared support element 115 is one that the non-conductive paste wets readily. In some embodiments, the underfill may extend no further away from the fan-out package 105 than the far edge of any of the second semiconductor dies 110, as shown in FIG. 6C, in which the stippled area is the underfill. Limiting the extent to which the underfill extends beyond the fan-out package 105 may be advantageous because the underfill, which may shrink when it cools, may adversely affect certain components that may be sensitive to the stress exerted by the underfill when it shrinks.

FIGS. 7-11 are additional perspective and side views of a subassembly including a fan-out package 105 and a second semiconductor die 110 on a shared support element 115, in one embodiment. Each of FIGS. 7-11 is drawn to scale, for one embodiment, with a scale bar in each of FIGS. 7-11 indicating the scale used. It will be understood that the dimensions and relative dimensions shown in FIGS. 7-11 (e.g., the vertical and horizontal depth of the rabbet, the clearance between the surfaces of the rabbet and the second semiconductor die 110, and the like) may be varied, i.e., increased or decreased, by as much as a factor of two (i.e., changed by a factor having a value between 0.50 and 2.00) while preserving some or all of the benefits of the illustrated embodiments.

Some embodiments may enable high-speed signaling to 100 Gbps/ch and beyond, while mitigating current packaging technology challenges. Process challenges, such as thinning the second semiconductor die 110, fabricating high aspect ratio CPBs, and high tolerance package dimensions, are reduced or mitigated. Utilizing the second semiconductor die 110 as an underfill dam in the package on wafer assembly process may result in an improvement of the component keep-out zone for UF bleed out during higher level assembly.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a fan-out package with a rabbet have been specifically described and illustrated herein, many modifications and variations will be apparent to those skilled in the art. Accordingly, it is to be understood that a fan-out package with a rabbet constructed according to principles of this disclosure may be embodied other than as specifically described herein.

The invention claimed is:

1. A system, comprising:
 a fan-out package, comprising:
  a first semiconductor die;
  a mold compound, covering the first semiconductor die on at least two sides; and
  an electrical contact, on a lower surface of the first semiconductor die,
 the fan-out package having a rabbet along a portion of a lower edge of the fan-out package, the rabbet being spaced apart from the first semiconductor die in a plan view,
 wherein the system further comprises a second semiconductor die in the rabbet, the second semiconductor die extending beyond an end of the rabbet in the plan view.

2. The system of claim 1, wherein a vertical depth of the rabbet is between 10 and 500 microns.

3. The system of claim 1, wherein a horizontal depth of the rabbet is between 10 and 500 microns.

4. The system of claim 1, wherein the fan-out package further comprises a redistribution layer, the redistribution layer being on a lower surface of the fan-out package.

5. The system of claim 4, wherein a portion of a vertical surface of the rabbet is an edge surface of the redistribution layer.

6. The system of claim 1, further comprising:
 a shared support element,
 the second semiconductor die and the fan-out package both being secured to an upper surface of the shared support element.

7. The system of claim 6, further comprising an electrically conductive path between the first semiconductor die and the second semiconductor die, the electrically conductive path having a length less than 200 microns.

8. The system of claim 6, wherein a clearance between the second semiconductor die and the fan-out package is at least 2 microns.

9. The system of claim 8, wherein the clearance between the second semiconductor die and the fan-out package is at most 100 microns.

10. The system of claim 6, wherein an upper edge of the second semiconductor die extends into the rabbet.

11. The system of claim 6, further comprising a layer of underfill between the fan-out package and shared support element, the layer of underfill extending horizontally to the second semiconductor die.

12. The system of claim 11, wherein the layer of underfill does not extend farther from the fan-out package than a part of the second semiconductor die most distant from the fan-out package.

13. A method for fabricating a fan-out package of, the fan-out package comprising:
 a first semiconductor die;
 a mold compound, covering the first semiconductor die on at least two sides; and
 an electrical contact, on a lower surface of the first semiconductor die,
 the fan-out package having a rabbet along a portion of a lower edge of the fan-out package, and
 the method comprising:
 fabricating a carrier comprising:
  a layer of the mold compound;
  a plurality of semiconductor dies comprising the first semiconductor die, embedded in the mold compound; and
  a redistribution layer, on the semiconductor dies and the mold compound;
 cutting a first channel into the carrier, the first channel having a first width and a first depth, and extending between the first semiconductor die and a second semiconductor die of the plurality of semiconductor dies; and
 cutting a second channel into the carrier, within the first channel, the second channel having a second width less than the first width and a second depth, from an upper surface of the carrier, greater than the first depth.

14. The method of claim 13, wherein the second channel has a depth equal to a thickness of the carrier and acts to separate a portion of the carrier on one side of the second channel from a portion of the carrier on another side of the second channel.

15. The method of claim 14, wherein the first channel has a width exceeding a width of the second channel by between 30 and 100 microns.

16. The method of claim 13, wherein the first channel has a depth of between 30 and 100 microns.

17. The method of claim 13, further comprising:
 cutting a plurality of channels into the carrier to form a plurality of fan-out packages, the plurality of channels including the first channel and the second channel, forming a subassembly by:

securing a first fan-out package, of the plurality of fan-out packages, to a shared support element, and
securing a third semiconductor die to the shared support element,
the subassembly comprising an electrically conductive path between the first semiconductor die and the third semiconductor die, the electrically conductive path having a length less than 200 microns.

18. The method of claim 17, further comprising:
dispensing underfill between the first fan-out package and the shared support element, and
damming, by the third semiconductor die, the underfill during the dispensing.

19. The system of claim 1, wherein the fan-out package is secured to an upper surface of a support element, and
wherein the system further comprises an electrically conductive path extending downward from the lower surface of the first semiconductor die to the upper surface of the support element.

20. A system, comprising:
a fan-out package, comprising:
  a first semiconductor die;
  a mold compound, covering the first semiconductor die on at least two sides;
  an electrical contact, on a lower surface of the first semiconductor die; and
  a redistribution layer directly on the lower surface of the first semiconductor die,
the fan-out package having a rabbet along a portion of a lower edge of the fan-out package, and
an edge surface of the redistribution layer forming a portion of the rabbet.

21. The system of claim 20, wherein the system further comprises a second semiconductor die in the rabbet, the second semiconductor die extending beyond an end of the rabbet in a plan view.

22. A system, comprising:
a fan-out package, comprising:
  a first semiconductor die,
  a mold compound, covering the first semiconductor die on at least two sides,
  an electrical contact, on a lower surface of the first semiconductor die, and
  a redistribution layer on a lower surface of the fan-out package;
a second semiconductor die;
a shared support element; and
a layer of underfill between the redistribution layer and the shared support element and extending to the second semiconductor die,
the fan-out package having a rabbet along a portion of a lower edge of the fan-out package.

23. The system of claim 22, wherein:
a vertical depth of the rabbet is between 10 and 500 microns, or
a horizontal depth of the rabbet is between 10 and 500 microns.

24. The system of claim 22, wherein the fan-out package further comprises a redistribution layer, the redistribution layer being on a lower surface of the fan-out package.

25. The system of claim 22, wherein the rabbet does not extend into the first semiconductor die.

26. The system of claim 22, further comprising an electrically conductive path between the first semiconductor die and the second semiconductor die, the electrically conductive path having a length less than 200 microns.

27. The system of claim 22, wherein the layer of underfill does not extend farther from the fan-out package than a part of the second semiconductor die most distant from the fan-out package.

* * * * *